United States Patent
Kim

(10) Patent No.: US 8,208,338 B2
(45) Date of Patent: Jun. 26, 2012

(54) SEMICONDUCTOR DEVICE

(75) Inventor: Jong-Hoon Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 294 days.

(21) Appl. No.: 12/719,979

(22) Filed: Mar. 9, 2010

(65) Prior Publication Data

US 2010/0155886 A1   Jun. 24, 2010

Related U.S. Application Data

(63) Continuation-in-part of application No. 11/797,988, filed on May 9, 2007, now Pat. No. 7,724,535.

(30) Foreign Application Priority Data

May 12, 2006  (KR) .................. 10-2006-0043068
Mar. 9, 2009   (KR) .................. 10-2009-0019963

(51) Int. Cl.
    *G11C 5/14* (2006.01)
(52) U.S. Cl. ....................................... 365/226; 365/227
(58) Field of Classification Search .................. 365/226, 365/227; 257/531, 532, 691
    See application file for complete search history.

(56) References Cited

U.S. PATENT DOCUMENTS

| | | |
|---|---|---|
| 3,683,271 A | 8/1972 | Kobayashi |
| 4,342,013 A | 7/1982 | Kallman |
| 5,422,782 A | 6/1995 | Hernandez et al. |
| 5,713,621 A | 2/1998 | Krenkel et al. |
| 5,926,061 A | 7/1999 | Usui |
| 5,963,023 A | 10/1999 | Herrell et al. |
| 6,310,387 B1 | 10/2001 | Seefeldt et al. |
| 6,355,970 B1 | 3/2002 | Fujii |
| 6,479,886 B1 | 11/2002 | Pollock et al. |

(Continued)

FOREIGN PATENT DOCUMENTS

JP    7-46748 B2    5/1995

(Continued)

OTHER PUBLICATIONS

Chrontel Inc., AN-28 Application Notes: "PCB Layout and Design Considerations for CH7007 and CH 7008", Jul. 9, 1999, pp. 1-10 of the specification and FIGS. 1-13. Stephen H. Hall et al., "High-Speed Digital System Design", John Wiley & Sons Inc., 2000, pp. 149-150.

*Primary Examiner* — Vu Le
(74) *Attorney, Agent, or Firm* — Volentine & Whitt, PLLC

(57) ABSTRACT

A semiconductor device is provided. The semiconductor device includes a chip having a plurality of first power voltage terminals connected in common to a first power voltage line, a plurality of second power voltage terminals connected in common with a second power voltage line, a first connection terminal, a second connection terminal connected to the first power voltage line or the second power voltage line, and an on-die capacitor. The semiconductor device also includes a package having a plurality of third power voltage terminals connected to the first power voltage terminals through a first wire by wire bonding during a packaging process and a plurality of fourth power voltage terminals connected to the second power voltage terminals through a second wire by wire bonding during the packaging process, and configured to package the chip, wherein one end of the on-die capacitor is connected to the first connection terminal, and the first connection terminal is connected to the second connection terminal through a third wire by wire bonding during the packaging process.

10 Claims, 17 Drawing Sheets

U.S. PATENT DOCUMENTS

| | | |
|---|---|---|
| 6,515,868 B1 | 2/2003 | Sasaki et al. |
| 6,519,741 B2 | 2/2003 | Yaguchi et al. |
| 6,677,781 B2 * | 1/2004 | Ishikawa et al. ............ 326/82 |
| 6,822,345 B2 | 11/2004 | Gauthier et al. |
| 6,870,436 B2 | 3/2005 | Grebenkemper |
| 6,920,051 B2 | 7/2005 | Figueroa et al. |
| 6,949,810 B2 | 9/2005 | Martwick |
| 2004/0217442 A1 | 11/2004 | Miyagi |
| 2005/0149894 A1 | 7/2005 | Shimazaki et al. |
| 2005/0270088 A1 | 12/2005 | Martwick |
| 2005/0286184 A1 | 12/2005 | Campolo |
| 2006/0092675 A1 | 5/2006 | Kajita |
| 2006/0220673 A1 * | 10/2006 | Hiranuma et al. ............ 326/27 |
| 2006/0291174 A1 | 12/2006 | Myat et al. |
| 2008/0232007 A1 | 9/2008 | Musat et al. |
| 2008/0258259 A1 * | 10/2008 | Osaka et al. .............. 257/532 |

FOREIGN PATENT DOCUMENTS

| | | |
|---|---|---|
| JP | 2000332198 A | 11/2000 |
| JP | 2003258612 A | 9/2003 |
| KR | 1020010011716 A | 2/2001 |
| KR | 20010020857 A | 3/2001 |
| KR | 100702034 B1 | 3/2007 |

* cited by examiner

SEMICONDUCTOR DEVICE

CROSS REFERENCE TO RELATED APPLICATIONS

This application claims the benefit of Korean Patent Application No. 10-2009-0019963 filed on Mar. 9, 2009 and is a Continuation-In-Part (CIP) application of U.S. patent application Ser. No. 11/797,988 filed on May 9, 2007. The collective disclosures of these applications are hereby incorporated by reference.

BACKGROUND

1. Field of the Inventive Concept

The inventive concept relates to semiconductor devices, methods related to semiconductor devices, and printed circuit boards incorporating semiconductor devices. More particularly, the inventive concept relates to semiconductor devices including an impedance circuit and an AC component interrupter, methods related to such semiconductor devices, and printed circuit boards incorporating an impedance circuit along with a semiconductor device.

2. Description of the Related Art

Semiconductor devices are used in high-speed and high-performance systems. Thus, a semiconductor device used in such a system needs a greater operating speed and a greater number of signal input and/or output terminals. In a semiconductor device, noise generated and/or induced over a power voltage or a ground voltage may be modeled as being proportional to the relationship (N×dI/dt), where "dI/dt" is a signal variation speed and "N" is a number of varying signals. This so-called "power voltage noise" may alter the perceived frequency of data/control signals or cause circuit malfunctions. Power voltage noise is proportional to the impedance of a terminal connecting element(s) internal to a semiconductor device and external element(s). Thus, power voltage noise may be generally reduced by reducing the apparent impedance of a connection terminal. One approach to reducing the impedance of any one connection terminal reduction suggests increasing the number of connection terminals provided by the semiconductor device.

FIG. 1 is a schematic diagram illustrating a conventional semiconductor device. The semiconductor device of FIG. 1 includes a chip 1 and a package 2.

Referring to FIG. 1, terminals 10-1 are power voltage terminals of chip 1, terminals 10-2 are ground voltage terminals of chip 1, terminals 20-1 are power voltage terminals of package 2, and terminals 20-2 are ground voltage terminals of package 2. Each terminal referred to herein may be a pad. In addition, VCCL is a power voltage line of chip 1, and GNDL is a ground voltage line of chip 1. When package 2 is a ball grid array (BGA) package, terminals 20-1 and 20-2 are balls, and when package 2 is a thin small outline package (TSOP), terminals 20-1 and 20-2 are pins. The power voltage line VCCL connects power voltage terminals 10-1 inside chip 1, and ground voltage line GNDL connects ground voltage terminals 10-2 inside chip 1.

FIG. 2 is an equivalent circuit diagram illustrating the semiconductor device of FIG. 1. In FIG. 2, "Rpkg" and "Lpkg" respectively represent a package resistance and a package inductance present in series between power voltage terminal 20-1 of package 2 and power voltage terminal 10-1 of chip 1. In addition, "Cdie" indicates a static capacitance present between power voltage line VCCL and ground voltage line GNDL, "I" indicates an electrical current that flows from power voltage line VCCL in chip 1 to ground voltage line GNDL, and "Vn" indicates power voltage noise.

A parallel resonant impedance Zp of the circuit illustrated in FIG. 2 is defined by Equation 1:

$$ZP = \frac{Vn}{I} = \frac{1}{j\omega Cdie + \frac{1}{Rpkg + j\omega Lpkg}}.$$

A resonant frequency obtained using Equation 1 is $$\frac{1}{2\pi \sqrt{CdieLpkg}}.$$

Power voltage noise Vn increases as electrical current I increases, and power voltage noise Vn has a maximum level at the resonant frequency. The resonant frequency is inversely proportional to inductance Lpkg, so when inductance Lpkg decreases, power voltage noise Vn decreases as well.

Accordingly, as one or more of the signal variation speed and the number of varying signals increases, electrical current I increases. Thus, power voltage noise Vn induced by the power voltage or the ground voltage also increases. In addition, when inductance Lpkg of package 2 increases, power voltage noise Vn increases.

However, because it is difficult to reduce the number of varying signals, power voltage noise Vn is reduced by increasing the number of power voltage terminals 20-1 and ground voltage terminals 20-2, which reduces the impedance of the terminals and thereby reduces inductance Lpkg of package 2.

However, while it is possible to increase the number of power voltage terminals 20-1 and ground voltage terminals 20-2 to reduce inductance Lpkg of package 2, increasing the number of power voltage terminals 20-1 and ground voltage terminals 20-2 has the disadvantage of increasing the size of package 2. That is, there is a limit to the amount that power voltage noise can be reduced by increasing the number of power voltage terminals 20-1 and ground voltage terminals 20-2. In addition, even though inductance Lpkg of package 2 can be reduced by increasing the number of terminals 20-1 and 20-2, increasing the number of terminals 20-1 and 20-2 shifts the resonant frequency to a frequency that is greater than an operable frequency of the semiconductor device and does not necessarily reduce the impedance at the resonant frequency. Thus, in the semiconductor device of FIG. 1, the power voltage noise which occurs at the resonant frequency may not be reduced.

FIG. 3 is a schematic diagram illustrating a conventional semiconductor device having a configuration intended to reduce power voltage noise. The semiconductor device of FIG. 3 is substantially the same as the semiconductor device of FIG. 1 except that the semiconductor device of FIG. 3 includes an impedance circuit 3 disposed between a power voltage terminal 20-1' of power voltage terminals 20-1 of package 2 and ground voltage GND.

Referring to FIG. 3, impedance circuit 3 is disposed outside of package 2; however, impedance circuit 3 may be disposed inside package 2 and may be disposed inside chip 1. When impedance circuit 3 is disposed outside of package 2, impedance circuit 3 may be mounted on package 2.

FIG. 4 is an equivalent circuit diagram illustrating the semiconductor device illustrated in FIG. 3. In FIGS. 2 and 4, like reference symbols indicate like elements or values. In FIG. 4, "Rpkg1" and "Lpkg1" respectively denote a first package resistance and a first package inductance present in series between a power voltage terminal 20-1 of package 2 and a power voltage terminal 10-1 of chip 1. In addition, "Rpkg2" and "Lpkg2" respectively denote a second package resistance and a second package inductance present in series between power voltage terminal 20-1' of package 2 and power voltage terminal 10-1 of chip 1.

In FIGS. 3 and 4, impedance circuit 3 may include a capacitor; a capacitor and a resistor connected to one another in series; or a capacitor, an inductor, and a resistor connected to one another in series. In other words, compared to the semiconductor device of FIG. 1, the semiconductor device of FIG. 3 additionally includes a serial resonant circuit between a power voltage terminal 20-1' of power voltage terminals 20-1 and ground voltage terminal 20-2.

A parallel resonant impedance Zp of the circuit illustrated in FIG. 4 is defined by Equation 1 by replacing Rpkg, Lpkg into Rpkg1, Lpkg1, respectively, and a serial resonant impedance Zs of that circuit is defined by Equation 2:

$$Zs = \frac{Vn}{I} = Rt + j\left(\omega Lt - \frac{1}{\omega Ct}\right).$$

It is assumed in Equation 2 that impedance circuit 3 includes a capacitor, an inductor, and a resistor, wherein, in Equation 2, the capacitance of the capacitor, the inductance of the inductor, and the resistance of the resistor are represented by C, L, and R, respectively. Also in Equation 2, Rt denotes Rpkg2+R, Ct denotes $$\frac{C \times Cdie}{C + Cdie},$$

and Lt denotes Lpkg2+L. A serial resonant frequency obtained by Equation 2 is $$\frac{1}{2\pi\sqrt{CtLt}}.$$

Power voltage noise Vn increases as electrical current I increases, and power voltage noise Vn has a minimum level at the serial resonant frequency. Also, because the serial resonant frequency is inversely proportional to inductance Lt, power voltage noise Vn decreases as inductance Lt decreases.

Thus, the semiconductor device of FIG. 3 reduces power voltage noise Vn by making the resonant frequency of the serial resonant circuit and the resonant frequency of the parallel resonant circuit the same and offsetting a maximum value of power voltage noise Vn obtained by resonance of the parallel resonant circuit with a minimum value of power voltage noise Vn obtained by resonance of the serial resonant circuit. That is, the semiconductor device of FIG. 3 can reduce power voltage noise Vn by reducing the impedance at the resonant frequency.

Alternatively, though it is not shown, impedance circuit 3 may be disposed between a terminal 20-2' of ground voltage terminals 20-2 and power voltage Vcc. In another alternative, an impedance circuit may be disposed between a terminal 20-1' of power voltage terminals 20-1 of package 2 and ground voltage GND and another impedance circuit may be disposed between a terminal 20-2' of ground voltage terminals 20-2 and power voltage Vcc.

Semiconductor devices analogous to the one illustrated in FIG. 3 are disclosed, for example, in U.S. Pat. No. 5,926,061.

Although the semiconductor device of FIG. 3 can be arranged such that it can reduce the AC component power voltage noise and such that impedance circuit 3 can reduce the impedance at the resonant frequency, the semiconductor device of FIG. 3 has the disadvantage of having a relatively large number of terminals receiving the power voltage or the ground voltage. Thus, the semiconductor device of FIG. 3 will suffer from a relatively large drop in the power voltage and/or ground voltage, so DC component power voltage noise will increase.

FIG. 5 is a schematic diagram illustrating a conventional printed circuit board (PCB). The PCB of FIG. 5 includes a substrate 30 having a plurality of layers, a semiconductor device 32, and decoupling capacitors 34-1 to 34-4. Substrate 30 includes signal line layers 30-1 and 30-4, a power voltage layer 30-2, and a ground voltage layer 30-3. In FIG. 5, the dots ("•") each represent a connection to power voltage layer 30-2, and the "×"s each represent a connection to ground voltage layer 30-3.

FIG. 6 is an equivalent circuit illustrating the PCB of FIG. 5. In FIG. 6, "Cp" denotes a capacitance that exists in the PCB; Lt denotes an inductance between power voltage terminal 40-1 of substrate 30 and power voltage layer 30-2 of substrate 30; "Cd", "Ld", and "Rd" represent a capacitance, an inductance, and a resistance, respectively, of decoupling capacitors 34-1 to 34-4, which are represented by element 34 in FIG. 6; and "Vpn" represents the power voltage noise between power voltage line PVCCL and ground voltage line PGNDL of substrate 30. "Rpkg", "Lpkg", "Cdie", and "I" represent the same values in FIG. 6 as in FIG. 2.

A parallel resonant impedance Za of the circuit of FIG. 6 is defined by Equation 3:

$$Za = \frac{Vpn}{I} = \frac{1}{j\omega Cp + \dfrac{1}{Rd + j\left(\omega Ld - \dfrac{1}{\omega Cd}\right)}} + j\omega L1.$$

A resonant frequency obtained through Equation 3 is $$\frac{1}{2\pi\sqrt{CdLd}}.$$

Power voltage noise Vpn increases as electrical current I increases, and power voltage noise Vpn has a maximum level at the resonant frequency. Also, since the resonant frequency is inversely proportional to inductance Ld, power voltage noise Vpn decreases as inductance Ld decreases.

Thus, in order to reduce the power voltage noise induced in the conventional PCB, the decoupling capacitors are added to thereby reduce inductance Ld. When "Ci", "Li", and "Ri" respectively represent a capacitance, an inductance, and a resistance of each of the decoupling capacitors, and N decoupling capacitors having the same capacitance, inductance, and resistance are connected to one another in parallel, the total capacitance, inductance, and resistance of the N decoupling capacitors are N×Ci, Li/N, and Ri/N, respectively. However, while power voltage noise can be reduced by reducing the inductance by adding decoupling capacitors to the PCB, adding the decoupling capacitors shifts the resonant frequency of the PCB to a frequency that is greater than an operable frequency of the semiconductor device mounted on the PCB, so the power voltage noise at the resonant frequency of the PCB of FIG. 5 cannot be reduced.

SUMMARY

Embodiments of the inventive concept provide semiconductor devices in which AC component power voltage noise is reduced and in which it is possible to prevent DC component power voltage noise from increasing, a method for reducing AC component power voltage noise and which may prevent DC component power voltage noise from increasing, and a printed circuit board (PCB) having reduced power voltage noise at the resonant frequency of the PCB.

In one embodiment, the inventive concept provides a semiconductor device comprising a chip comprising a plurality of first power voltage terminals and a plurality of first ground voltage terminals, a package comprising a plurality of second power voltage terminals connected to the plurality of first power voltage terminals and a plurality of second ground voltage terminals connected to the plurality of first ground voltage terminals, wherein the chip is disposed in the package. The semiconductor device further comprises an impedance circuit connected between a DC component second power voltage terminal and a ground voltage, wherein the DC component second power voltage terminal is one of the plurality of second power voltage terminals, and an AC component interrupter connected between the DC component second power voltage terminal and a power voltage and interrupting an AC component of the power voltage. Both the AC component and a DC component of the power voltage are applied to each of the second power voltage terminals except the DC component second power voltage terminal, and the ground voltage is applied to each of the second ground voltage terminals.

In another embodiment, the inventive concept provides a semiconductor device comprising a chip comprising a plurality of first power voltage terminals and a plurality of first ground voltage terminals, and a package comprising a plurality of second power voltage terminals connected to the plurality of first power voltage terminals and a plurality of second ground voltage terminals connected to the plurality of first ground voltage terminals, wherein the chip is disposed in the package. The semiconductor device further comprises a first impedance circuit connected between a DC component second ground voltage terminal and a power voltage, wherein the DC component second ground voltage terminal is one of the plurality of second ground voltage terminals, and a first AC component interrupter connected between the DC component second ground voltage terminal and a ground voltage and interrupting an AC component of the ground voltage. The AC component and a DC component of the ground voltage is provided to each of the second ground voltage terminals except the DC component second ground voltage terminal, and an AC component and a DC component of the power voltage is applied to at most each of the second power voltage terminals.

The semiconductor device may further comprise a second impedance circuit connected between a DC component second power voltage terminal and the ground voltage, wherein the DC component second power voltage terminal is one of the plurality of second power voltage terminals; and a second AC component interrupter connected between the DC component second power voltage terminal and the power voltage and interrupting an AC component of the power voltage, wherein only the DC component of the power voltage is provided to the DC component second power voltage terminal.

In yet another embodiment, the inventive concept provides a semiconductor device comprising a chip having a plurality of first power voltage terminals connected in common to a first power voltage line, a plurality of second power voltage terminals connected in common to a second power voltage line, a first connection terminal, a second connection terminal connected to the first power voltage line or the second power voltage line, and an on-die capacitor, and a package having a plurality of third power voltage terminals connected to the first power voltage terminals through a first wire by wire bonding during a packaging process and a plurality of fourth power voltage terminals connected to the second power voltage terminals through a second wire by wire bonding during the packaging process to package the chip. One end of the on-die capacitor is connected to the first connection terminal, and the first connection terminal is connected to the second connection terminal through a third wire by wire bonding during the packaging process.

The semiconductor device may adjust a capacitance of the on-die capacitor such that a product of the capacitance of the on-die capacitor and an inductance of the third wire is equal to a product of an inductance of a package inductor present in the package and a capacitance of a static capacitor present in the chip.

An example of the on-die capacitor may have a plurality of groups of a serially connected fuse and capacitor connected in parallel between one end and the other end of the on-die capacitor, and the capacitance of the on-die capacitor may be adjusted by cutting the fuses.

Another example of the on-die capacitor may have a plurality of groups of a serially connected switch and capacitor connected in parallel between one end and the other end of the on-die capacitor. Here, the semiconductor device may further comprise a switching control signal generator configured to receive a code signal and set a plurality of switching control signals in response to a command signal applied from the outside, and the switches are respectively turned ON or OFF in response to the switching control signals and change the capacitance of the on-die capacitor.

The inductance may be additionally adjusted by adjusting a length of the third wire.

In still another embodiment, the inventive concept provides a semiconductor device comprising a chip having a plurality of first power voltage terminals connected in common to a first power voltage line, a plurality of second power voltage terminals connected in common to a second power voltage line, a first connection terminal, a second connection terminal, a first on-die capacitor, and a second on-die capacitor, and a package having a plurality of third power voltage terminals connected to the first power voltage terminals through a first wire by wire bonding during a packaging process and a plurality of fourth power voltage terminals connected to the second power voltage terminals through a second wire by wire bonding during the packaging process to package the chip. The first on-die capacitor is connected between the first connection terminal and the first power voltage line, the second on-die capacitor is connected between the second connection terminal and the second power voltage line, and the first connection terminal is connected to the second connection terminal through a third wire by wire bonding during the packaging process.

In still another embodiment, the inventive concept provides a method for reducing power voltage noise in a semiconductor device comprising a chip comprising a plurality of first power voltage terminals and a plurality of first ground voltage terminals; and a package comprising a plurality of second power voltage terminals connected to the plurality of first power voltage terminals and a plurality of second ground voltage terminals connected to the plurality of first ground voltage terminals, wherein the chip is disposed in the package. The method comprises reducing AC component power voltage noise using a first serial resonant circuit connected between a DC component second power voltage terminal and a ground voltage, wherein the DC component second power voltage terminal is one of the plurality of second power voltage terminals; and interrupting an AC component of a power voltage using a first AC component interrupter connected between the DC component second power voltage terminal and the power voltage. The method further comprises providing both the AC component and a DC component of the power voltage to each of the second power voltage terminals except the DC component second power voltage terminal; and providing both an AC component and a DC component of the ground voltage to at most each of the second ground voltage terminals.

In still another embodiment, the inventive concept provides a PCB comprising a substrate comprising a power voltage layer supplying a power voltage and a ground voltage layer supplying a ground voltage; a plurality of decoupling capacitors connected between the power voltage and the ground voltage, wherein the plurality of decoupling capacitors make a resonant frequency of the PCB higher than an operable frequency of the PCB; and an impedance circuit connected between the power voltage and the ground voltage and reducing an impedance at the resonant frequency.

BRIEF DESCRIPTION OF THE DRAWINGS

Embodiments of the inventive concept will be described with reference to the accompanying drawings. In the drawings.

DETAILED DESCRIPTION OF THE EMBODIMENTS

Embodiments of the inventive concept will now be described in some additional detail with reference to the accompanying drawings. The drawings may not be drawn to scale, and like reference symbols indicate like or similar elements throughout the drawings.

Figure 7:
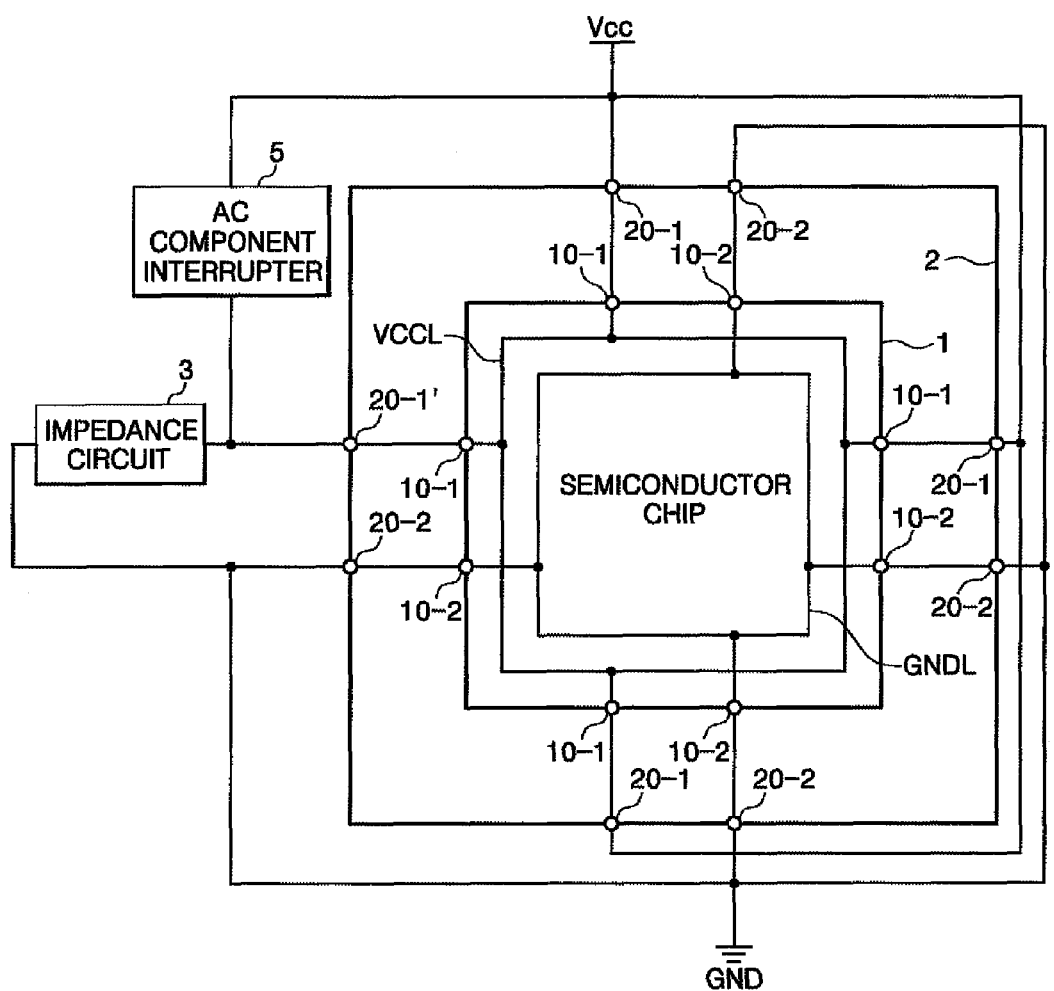
FIG. 7 is a schematic diagram illustrating a semiconductor device in accordance with a first embodiment of the inventive concept.

FIG. 7 is a schematic diagram illustrating a semiconductor device in accordance with a first embodiment of the inventive concept. The semiconductor device illustrated in FIG. 7 is similar to the semiconductor device illustrated in FIG. 3, except that one of power voltage terminals 20-1 is a DC component power voltage terminal 20-1', and the semiconductor device illustrated in FIG. 7 additionally comprises an AC component interrupter 5 electrically connected between a power voltage Vcc and DC component power voltage terminal 20-1'. AC component interrupter 5 may comprise a Ferrite or an inductor. In FIG. 7, AC component interrupter 5 is disposed outside of the semiconductor device (i.e., outside of package 2); however, AC component interrupter 5 may be disposed inside package 2 and also may be disposed inside chip 1.

Figure 1:
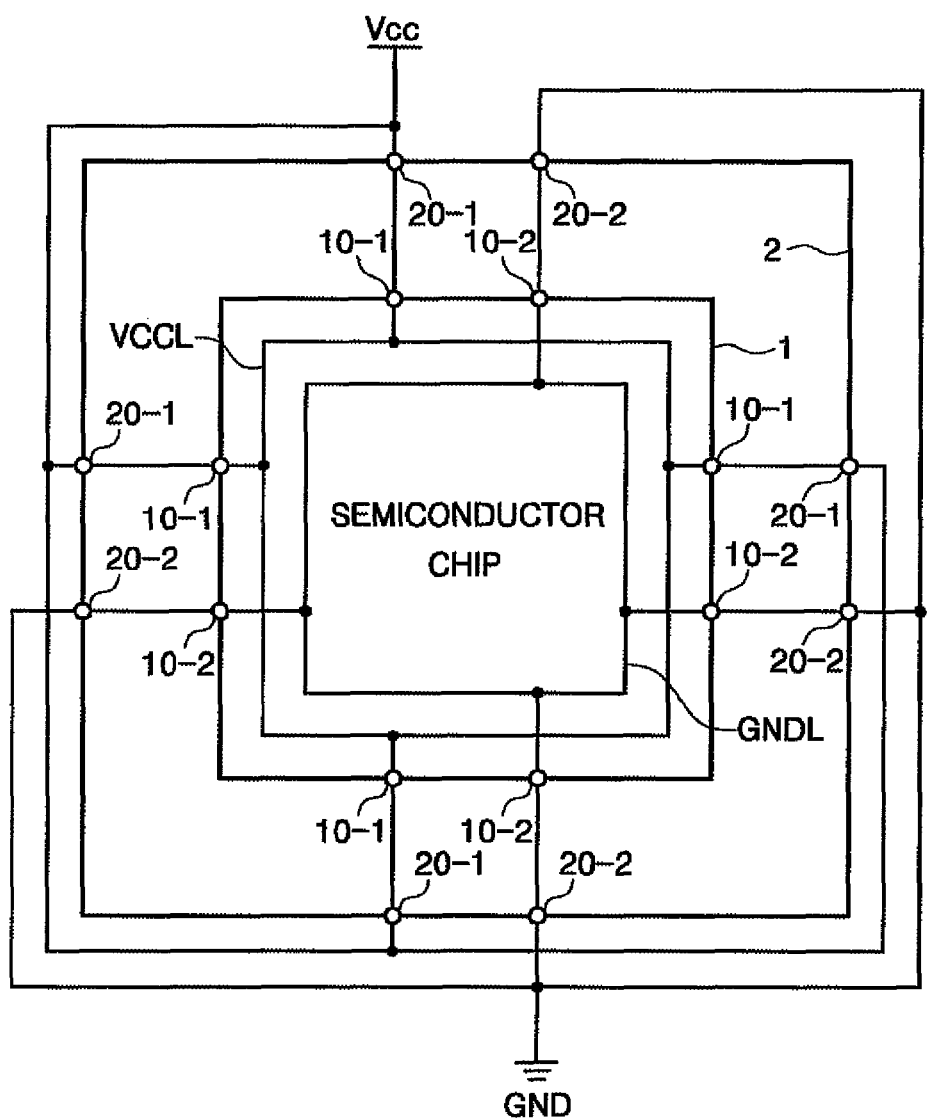
FIG. 1 is a schematic diagram illustrating a conventional semiconductor device.
Figure 2:
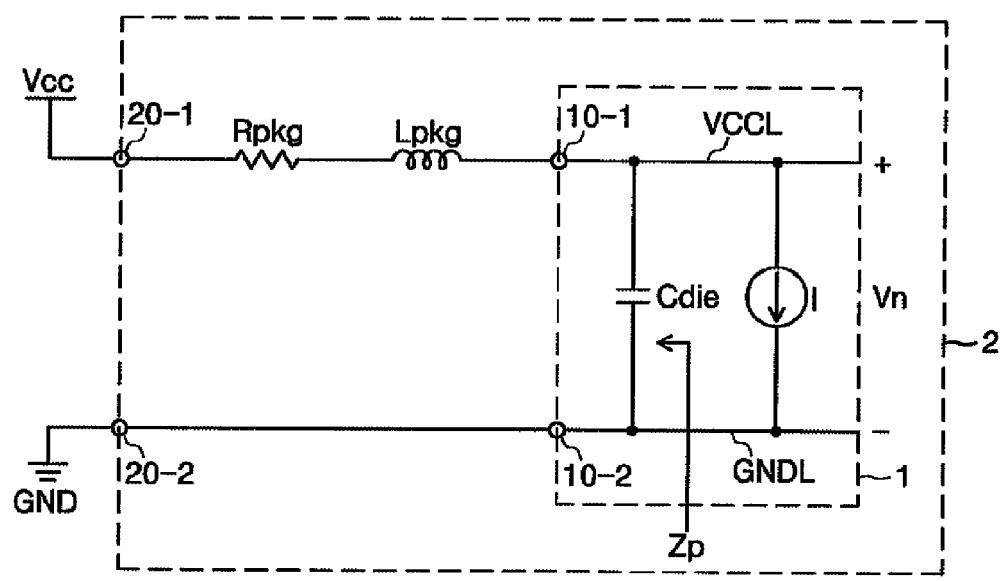
FIG. 2 is an equivalent circuit illustrating the semiconductor device of FIG. 1.

The semiconductor device of FIG. 7 uses AC component interrupter 5 to interrupt the AC component of power voltage Vcc and applies only the DC component of power voltage Vcc to DC component power voltage terminal 20-1'. Thus, because the DC component of power voltage Vcc is provided to the semiconductor device via DC component power voltage terminal 20-1', the number of power voltage terminals in the semiconductor device does not decrease (relative to the device of FIG. 1), so the impedance of power voltage terminals 20-1 (including DC component power voltage terminal 20-1') does not increase and the level of power voltage Vcc does not drop. As a result, the power voltage noise of the DC component of power voltage Vcc does not increase. The power voltage noise of the DC component of power voltage Vcc may be referred to herein as "DC component power voltage noise." In addition, the power voltage noise of the AC component of power voltage Vcc may be referred to herein as "AC component power voltage noise," the ground voltage noise of the DC component of ground voltage GND may be referred to herein as "DC component ground voltage noise," and the ground voltage noise of the AC component of ground voltage GND may be referred to herein as "AC component ground voltage noise."

Figure 3:
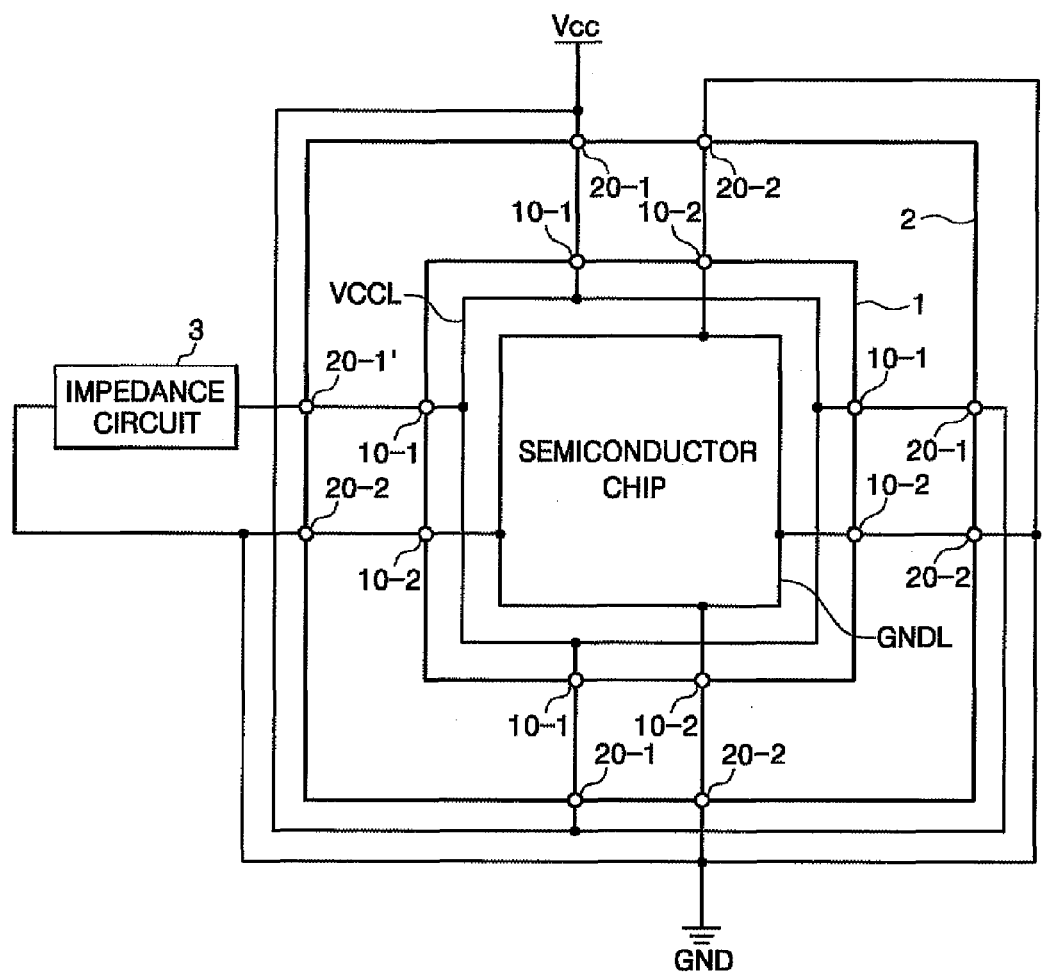
FIG. 3 is a schematic diagram illustrating another conventional semiconductor device.
Figure 4:
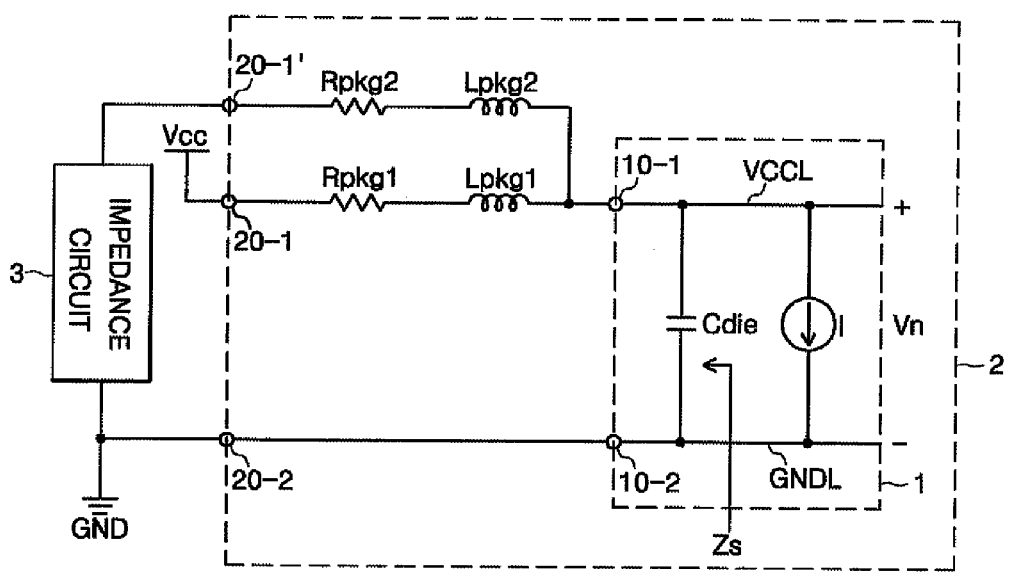
FIG. 4 is an equivalent circuit illustrating the semiconductor device of FIG. 3.

The conventional semiconductor device of FIG. 3 cannot apply power voltage Vcc to the semiconductor device via DC component power voltage terminal 20-1', so the impedance of power voltage terminals 20-1 increases, which leads to an increase in the DC component power voltage noise. However, in the embodiment illustrated in FIG. 7, the DC component of power voltage Vcc is applied to the semiconductor device via DC component power voltage terminal 20-1', so the impedance of power voltage terminals 20-1 (including DC component power voltage terminal 20-1') does not increase and the DC component power voltage noise does not increase.

The semiconductor device of FIG. 7 uses impedance circuit 3 to reduce the AC component power voltage noise and uses AC component interrupter 5 to prevent the DC component power voltage noise from increasing.

Figure 8:
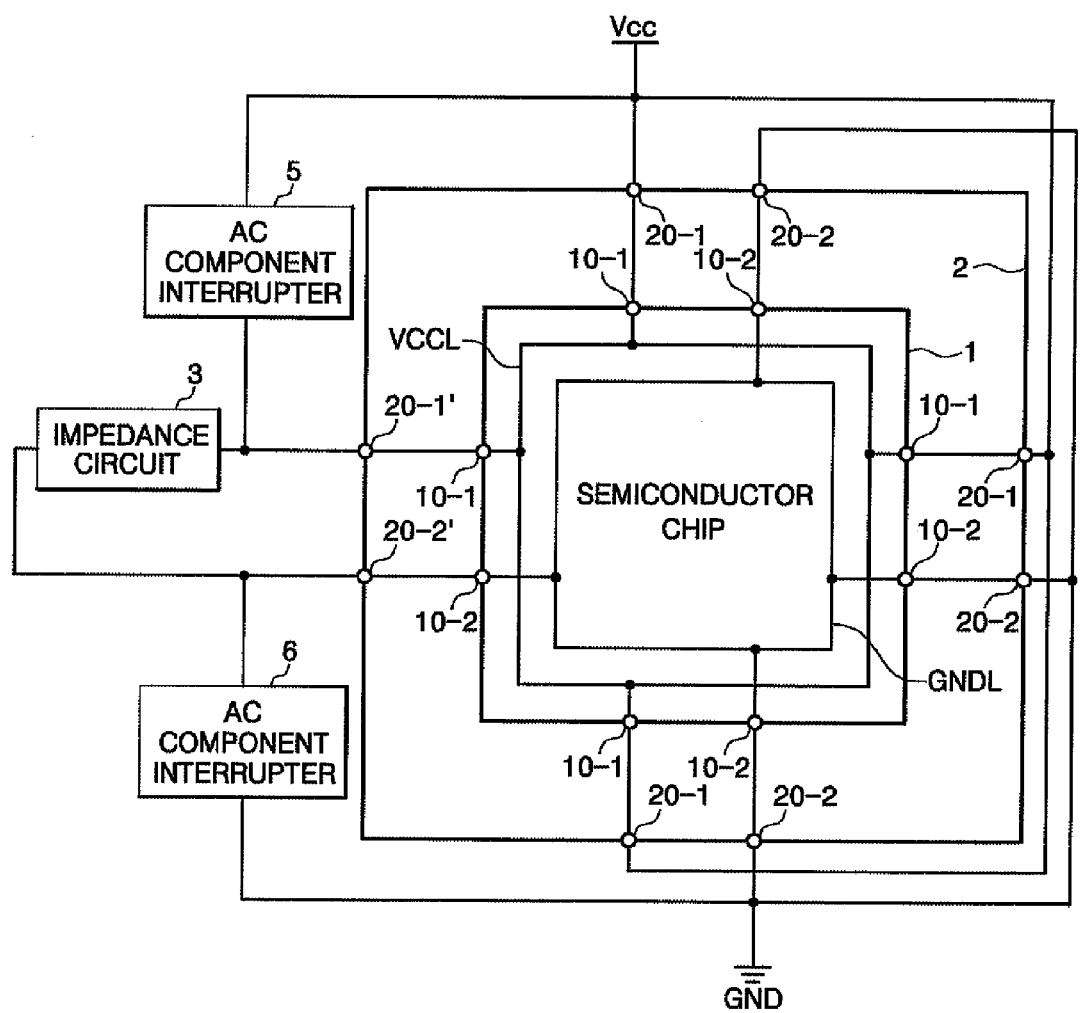
FIG. 8 is a schematic diagram illustrating a semiconductor device in accordance with a second embodiment of the inventive concept.

FIG. 8 is a schematic diagram illustrating a semiconductor device in accordance with a second embodiment of the inventive concept. The semiconductor device of FIG. 8 is similar to the semiconductor device of FIG. 7, except that one of ground voltage terminals 20-2 is a DC component ground voltage terminal 20-2', and the semiconductor device of FIG. 8 additionally comprises an AC component interrupter 6. AC component interrupter 6 may comprise a Ferrite or an inductor. In addition, in the embodiment illustrated in FIG. 8, AC component interrupter 6 is disposed outside of the semiconductor device (i.e., outside of package 2); however, AC component interrupter 6 may be disposed inside package 2 and may also be disposed inside chip 1.

In the semiconductor device of FIG. 8, AC component interrupter 6 interrupts the AC component of ground voltage GND and applies only the DC component of ground voltage GND to DC component ground voltage terminal 20-2' (which is one of ground voltage terminals 20-2). Thus, since the DC component of ground voltage GND is applied to the semiconductor device via DC component ground voltage terminal 20-2', the number of ground voltage terminals 20-2 of the semiconductor device is not reduced (relative to the device of FIG. 1), so the impedance of ground voltage terminals 20-2 (including DC component ground voltage terminal 20-2') does not increase and the level of ground voltage GND does not drop. As a result, it is possible to substantially prevent the DC component ground voltage noise from increasing.

That is, the semiconductor device of FIG. 8 can apply ground voltage GND (i.e., the DC component of ground voltage GND) to the semiconductor device via DC component ground voltage terminal 20-2', so the impedance of ground voltage terminals 20-2 (including DC component ground voltage terminal 20-2') does not increase, and it is possible to prevent the DC component ground voltage noise from increasing.

The semiconductor device of FIG. 8 not only uses impedance circuit 3 to reduce the AC component ground voltage noise, but also uses AC component interrupter 6 to prevent the DC component ground voltage noise from increasing. In an alternative embodiment of the inventive concept, the semiconductor device of FIG. 8 does not include AC component interrupter 5.

In another embodiment of the inventive concept, the semiconductor device of FIG. 8 may also comprise a second impedance circuit connected between DC component ground terminal 20-2' and power voltage Vcc. The second impedance circuit may be a serial resonant circuit and may be used to reduce AC component power voltage noise.

A method for reducing power voltage noise in a semiconductor device in accordance with an embodiment of the inventive concept will now be described with reference to FIGS. 7 and 8. Referring to FIG. 8, for example, in accordance with an embodiment of the inventive concept, the method for reducing power voltage noise in the semiconductor device illustrated in FIG. 8 comprises reducing an AC component power voltage noise using impedance circuit 3 (i.e., a first serial resonant circuit) connected between DC component second power voltage terminal 20-1' and ground voltage GND. DC component second power voltage terminal 20-1' is one of the plurality of second power voltage terminals 20-1. The method further comprises interrupting an AC component of power voltage Vcc using AC component interrupter 5 (i.e., a first AC component interrupter) connected between DC component second power voltage terminal 20-1' and power voltage Vcc, providing both the AC component and a DC component of power voltage Vcc to each of second power voltage terminals 20-1 except DC component second power voltage terminal 20-1', and providing both an AC component and a DC component of ground voltage GND to at most each of second ground voltage terminals 20-2. Only the DC component of power voltage Vcc is provided to DC component second power voltage terminal 20-1'. The method described above may also be performed using the semiconductor device of FIG. 7.

Referring to FIG. 8, the method may further comprise reducing the AC component power voltage noise using a second impedance circuit (i.e., a second serial resonant circuit) connected between DC component second ground voltage terminal 20-2' and power voltage Vcc. DC component second ground voltage terminal 20-2' is one of the plurality of second ground voltage terminals 20-2. The method may still further comprise interrupting an AC component of ground voltage GND using AC component interrupter 6 (i.e., a second AC component interrupter) connected between DC component second ground voltage terminal 20-2' and ground voltage GND and providing only the DC component of ground voltage GND to DC component ground voltage terminal 20-2'.

Figure 9:
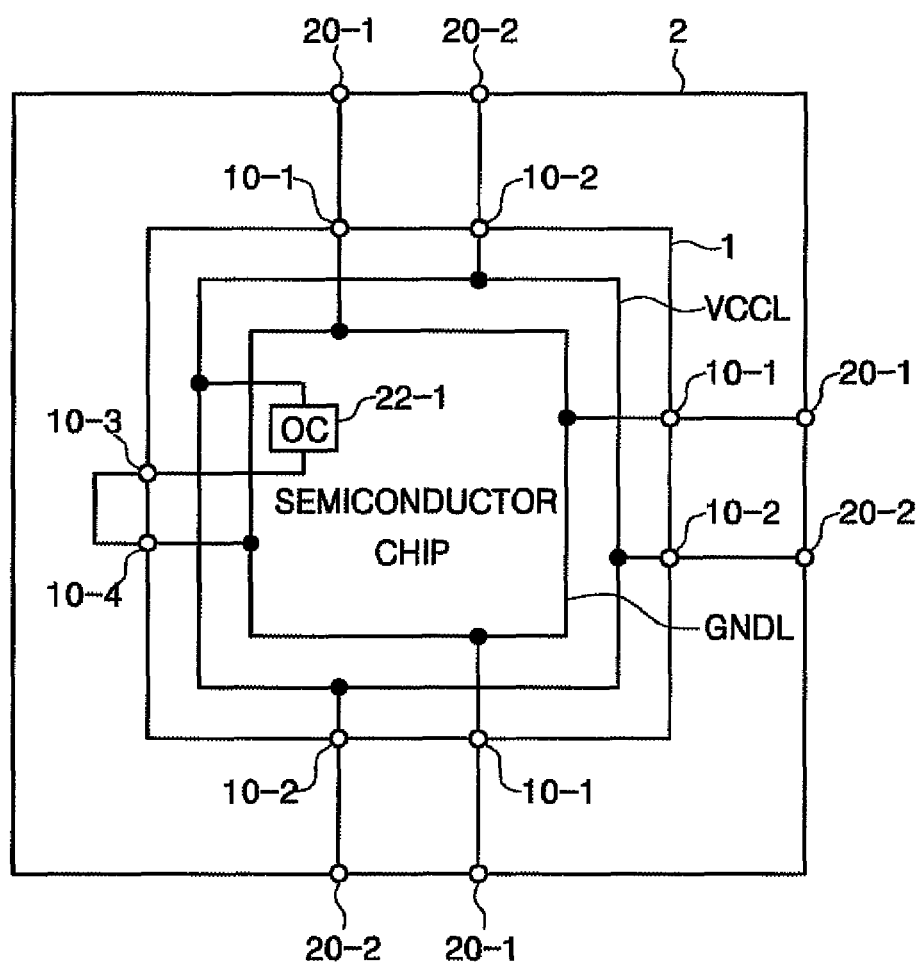
FIG. 9 is a schematic diagram illustrating a semiconductor device in accordance with a third embodiment of the inventive concept.

FIG. 9 is a schematic diagram illustrating a semiconductor device in accordance with an embodiment of the inventive concept. The exemplary semiconductor device comprises chip 1 and package 2.

Chip 1 has power voltage terminals 10-1, ground voltage terminals 10-2, power voltage line VCCL connected to the power voltage terminals 10-1 and applying a power voltage, ground voltage line GNDL connected to ground voltage terminal 10-2 and applying a ground voltage, first connection terminal 10-3, second connection terminal 10-4, and on-die capacitor OC. On-die capacitor OC is connected to power voltage line VCCL and first connection terminal 10-3, ground voltage line GNDL is connected to second connection terminal 10-4, and first connection terminal 10-3 and second connection terminal 10-4 are connected through a wire by wire bonding during a packaging process.

Package 2 has power voltage terminals 20-1 that are connected to power voltage terminals 10-1 of chip 1 through a wire by wire bonding during the packaging process, and ground voltage terminals 20-2 that are connected to ground voltage terminals 10-2 of chip 1 through a wire by wire bonding.

In FIG. 9, the terminals of chip 1 may be pads, and the terminals of package 2 may be balls or pins.

Thus, the semiconductor device shown in FIG. 9 comprises on-die capacitor OC 22-1, an inductor consisting of a wire, and a resistance of a connection line between power voltage line VCCL and ground voltage line GNDL connected in series between power voltage line VCCL and ground voltage line GNDL.

For this reason, by making a parallel resonant frequency caused by a package inductor between power voltage terminals 20-1 of package 2 and power voltage terminals 10-1 of chip 1 and a static capacitor of chip 1 between power voltage terminal 10-1 and ground voltage line GNDL of chip 1 the same as a serial resonant frequency caused by the capacitance of on-die capacitor OC between power voltage line VCCL and ground voltage line GNDL and the inductance of a wire, impedance at the resonant frequency of the semiconductor device is reduced, such that power voltage noise can be reduced.

In FIG. 9, the inductance of an inductor can be adjusted according to the length of a wire, and the capacitance of on-die capacitor OC 22-1 can also be adjusted in various ways. A capacitance adjustment method will be described later.

Figure 10:
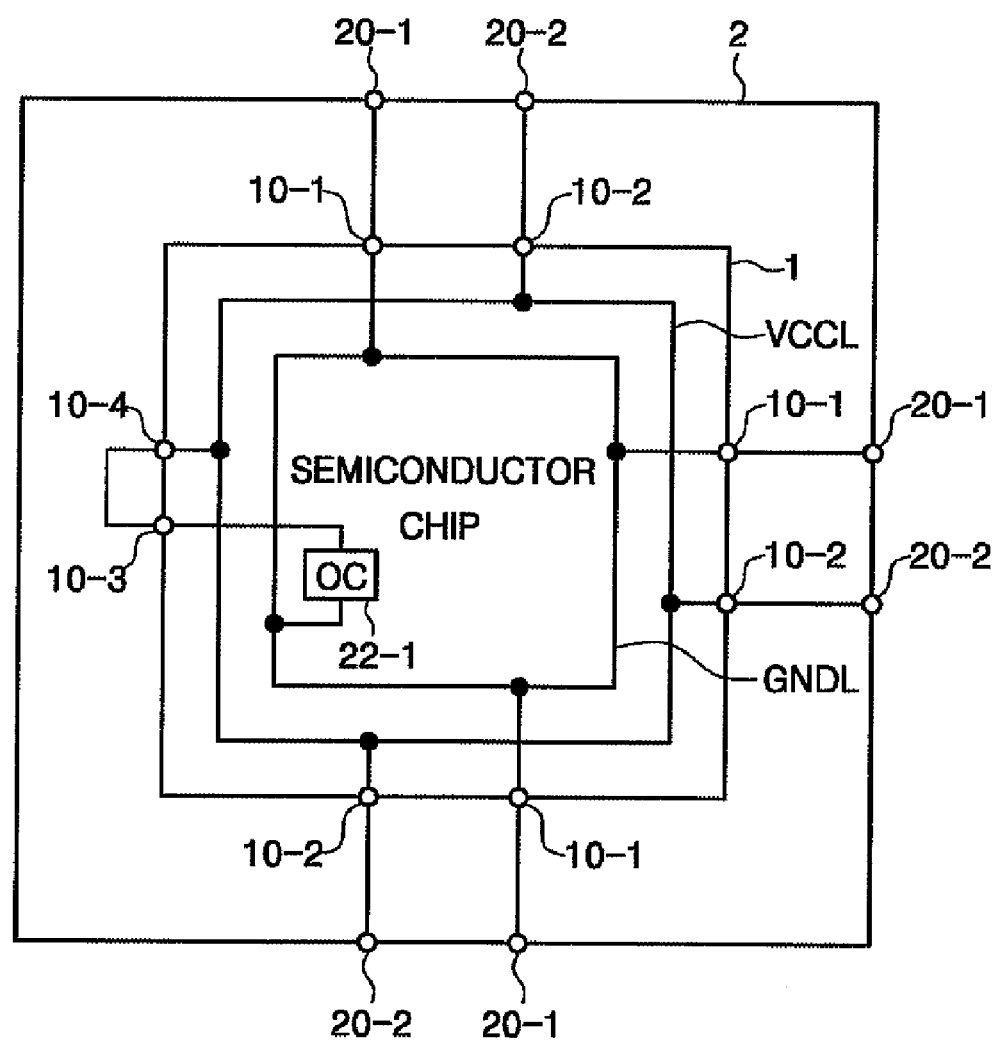
FIG. 10 is a schematic diagram illustrating a semiconductor device in accordance with a fourth embodiment of the inventive concept.

FIG. 10 is a schematic diagram illustrating a semiconductor device in accordance with a fourth embodiment of the inventive concept. The semiconductor device is similar to the semiconductor device illustrated in FIG. 9, except that on-die capacitor OC 22-1 is not connected between first connection terminal 10-3 and power voltage line VCCL but between first connection terminal 10-3 and ground voltage line GNDL, and second connection terminal 10-4 is not connected to ground voltage line GNDL but with power voltage line VCCL. The semiconductor device of FIG. 10 has different connections than the semiconductor device of FIG. 9 but can reduce power voltage noise identically to the semiconductor device of FIG. 9.

More specifically, the semiconductor device of FIG. 10 has on-die capacitor OC 22-2, an inductor consisting of a wire, and a resistance of a connection line between power voltage line VCCL and ground voltage line GNDL connected in series between power voltage line VCCL and ground voltage line GNDL. Thus, by making a parallel resonant frequency caused by a package inductor between power voltage terminals 20-1 of package 2 and power voltage terminals 10-1 of chip 1 and a static capacitor of chip 1 between power voltage terminal 10-1 and ground voltage line GNDL the same as a serial resonant frequency caused by the capacitance of on-die capacitor OC between power voltage line VCCL and ground voltage line GNDL and the inductance of an inductor consisting of a wire, impedance at a resonant frequency is reduced, such that power voltage noise can be reduced.

Figure 11:
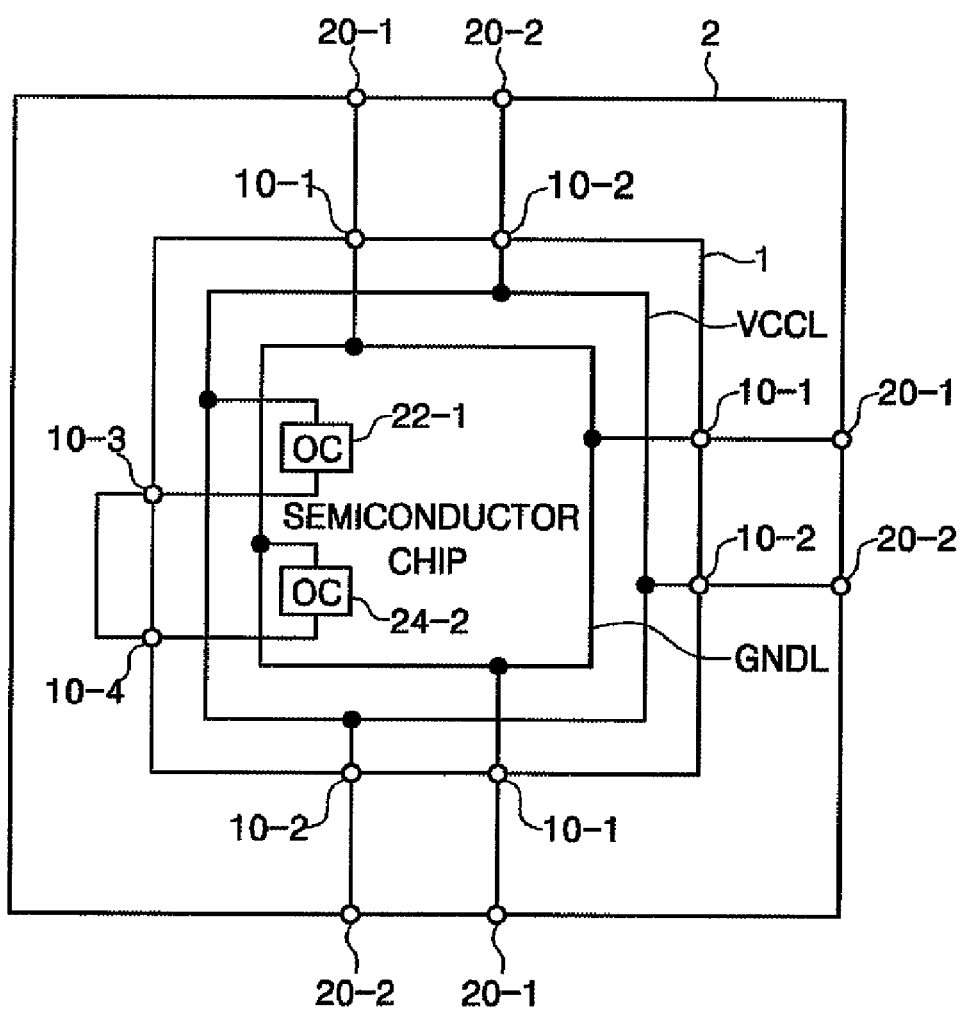
FIG. 11 is a schematic diagram illustrating a semiconductor device in accordance with a fifth embodiment of the inventive concept.

FIG. 11 is a schematic diagram illustrating a semiconductor device in accordance with a fifth embodiment of the inventive concept. The semiconductor device is similar to the semiconductor device illustrated in FIG. 9, except that it has on-die capacitor OC 22-2 connected between second connection terminal 10-4 and ground voltage line GNDL in addition to on-die capacitor OC 22-1 connected between first connection terminal 10-3 and power voltage line VCCL.

The semiconductor device of FIG. 11 has different connections than the semiconductor device of FIG. 9 but similarly reduces power voltage noise as compared with the semiconductor device of FIG. 9.

More specifically, the semiconductor device of FIG. 11 has on-die capacitor OC 22-1, on-die capacitor OC 22-2, an inductor consisting of a wire, and a resistance of a connection line between power voltage line VCCL and ground voltage line GNDL connected in series between power voltage line VCCL and ground voltage line GNDL. Thus, by making a parallel resonant frequency caused by a package inductor between power voltage terminals 20-1 of package 2 and power voltage terminals 10-1 of chip 1 and a static capacitor of chip 1 between power voltage terminal 10-1 and ground voltage line GNDL the same as a serial resonant frequency caused by the capacitance of on-die capacitor OC between power voltage line VCCL and ground voltage line GNDL and the inductance of an inductor consisting of a wire, impedance at a resonant frequency is reduced, such that power voltage noise can be reduced.

A semiconductor device according to the inventive concept is not limited to only the embodiments illustrated in FIGS. 9 to 11, and may include any constitution in which the capacitance of an on-die capacitor and an inductor consisting of a wire are connected in series between power voltage line VCCL and ground voltage line GNDL. Also, a product of the capacitance of the on-die capacitor and the inductance of the inductor consisting of a wire is made equal to a product of the inductance of a package inductor in package 2 and the capacitance of the static capacitor in chip 1 to thereby reduce impedance at a resonant frequency and power voltage noise.

Figure 12:
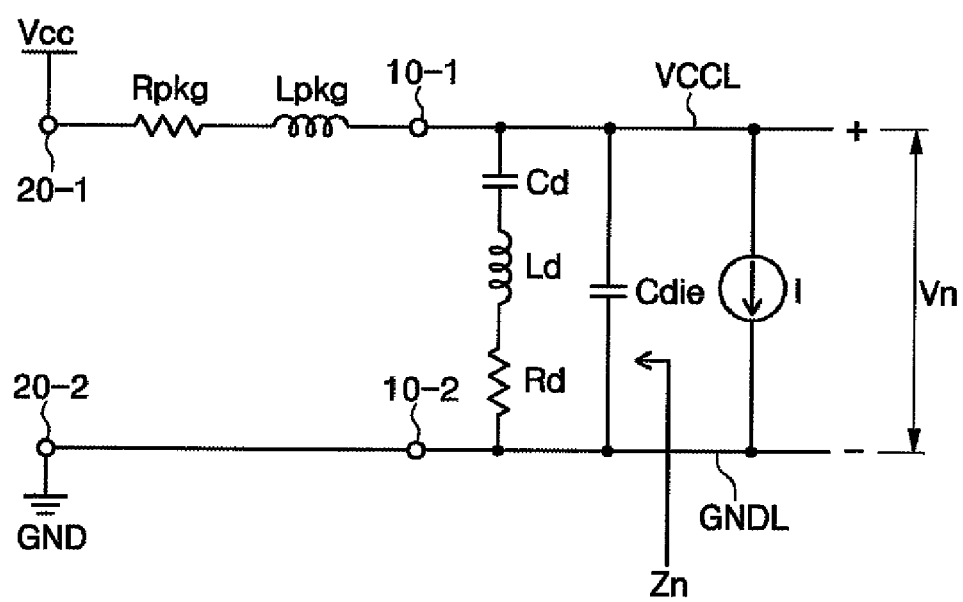
FIG. 12 is an equivalent circuit illustrating a semiconductor device in accordance with an embodiment of the inventive concept.

FIG. 12 is an equivalent circuit diagram illustrating a semiconductor device in accordance with an embodiment of the inventive concept. In FIG. 12, "Rpkg" and "Lpkg" respectively represent a package resistance and a package inductance present in series between power voltage terminal 20-1 of package 2 and power voltage terminal 10-1 of chip 1. In addition, "Cdie" indicates a static capacitance of chip 1 present between power voltage line VCCL and ground voltage line GNDL, "Cd" indicates a capacitance of on-die capacitor OC, "Ld" indicates the inductance of an inductor consisting of a wire, "Rd" indicates a connection resistance, "I" indicates an electrical current that flows from power voltage line VCCL to ground voltage line GNDL in chip 1, and "Vn" indicates power voltage noise. Rpkg and Lpkg are components that are not artificially formed but naturally present in package 2, and Cdie is also a component that is not artificially formed but naturally present. On the other hand, on-die capacitor OC is formed on chip 1, and inductor Ld is formed by a wire during a bonding operation in a packaging process. On-die capacitor OC can be formed in the same way as a capacitor formed on the substrate of chip 1, and a description of the method will be omitted.

In FIG. 12, parallel resonant frequency "fp" of the circuit is $$\frac{1}{2\pi\sqrt{LpkgCdie}},$$

and serial resonant frequency "fs" of the circuits of FIGS. 9 and 10 is $$\frac{1}{2\pi\sqrt{Cd \cdot Ld}}.$$

In the semiconductor device of FIG. 11, on-die capacitors OC 22-1 and 22-2 are connected in series. Thus, given that the capacitance of on-die capacitor 22-1 is Cd1 and the capacitance of on-die capacitor 22-2 is Cd2, the capacitance is Cd1+Cd2, and serial resonant frequency fs of the circuit is $$\frac{1}{2\pi\sqrt{(Cd1+Cd2)Ld}}.$$

When parallel resonant frequency fp and serial resonant frequency fs are made to be the same, resonant frequency "fr" of the circuit becomes serial resonant frequency fs or parallel resonant frequency fp, and impedance at frequency fr is reduced. As a result, power voltage noise Vn decreases. In other words, impedance is maximized at parallel resonant frequency fp of the circuit and minimized at serial resonant frequency fs of the circuit. Thus, when serial resonant frequency fs of the circuit is made to be the same as parallel resonant frequency fp of the circuit, impedance at resonant frequency fr is reduced, and power voltage noise Vn decreases.

To be specific, when capacitance Cd and inductance Ld are not formed in the semiconductor device of FIG. 12, impedance is maximized at a parallel resonant frequency between package 2 and chip 1, and thus power voltage noise is maximized. To cancel out power voltage noise, in a semiconductor device in accordance with an embodiment of the inventive concept, the capacitance of on-die capacitor OC and the inductance of a wire are inserted between power voltage line VCCL and ground voltage line GNDL and adjusted such that serial resonant frequency fs caused by the capacitance and inductance can be the same as parallel resonant frequency fp. In addition, since impedance is maximized at serial resonant frequency fs, the maximum impedance at parallel resonant frequency fp is reduced by the minimum impedance at serial resonant frequency fs. Thus, impedance at a resonant frequency is reduced, and power voltage noise decreases.

Figure 13:
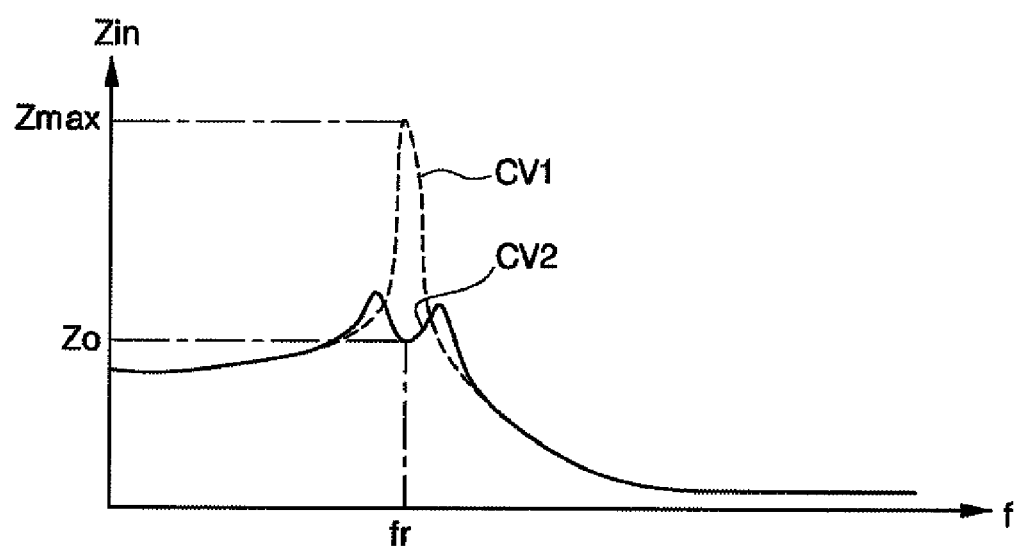
FIG. 13 is a graph illustrating an impedance characteristic with respect to a frequency of a semiconductor device in accordance with an embodiment of the inventive concept.

FIG. 13 is a graph illustrating an impedance characteristic with respect to a frequency of a semiconductor device in accordance with an embodiment of the inventive concept. In the graph of FIG. 13, the horizontal axis represents frequency, the vertical axis represents impedance Zin, dotted line CV1 shows variation in parallel impedance Zmax at resonant frequency fr when capacitance Cd and inductance Ld are not inserted, and solid line CV2 shows variation in impedance Zo at resonant frequency fr when capacitance Cd and inductance Ld are inserted.

It is evident from the graph of FIG. 13 that, while maximum impedance Zmax is obtained at parallel resonant frequency fp when capacitance Cd and inductance Ld are not inserted, indicating that power voltage noise is relatively high, impedance at resonant frequency fr is reduced to impedance Zo by the minimum impedance at serial resonant frequency fs caused by capacitance Cd and inductance Ld when capacitance Cd and inductance Ld are inserted, indicating that power voltage noise decreases.

Figure 14:
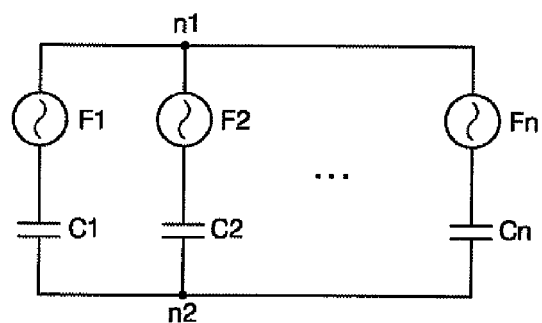
FIG. 14 is a schematic diagram illustrating an on-die capacitor of a semiconductor device in accordance with an embodiment of the inventive concept.

FIG. 14 is a schematic diagram illustrating an on-die capacitor of a semiconductor device in accordance with an embodiment of the inventive concept. In the on-die capacitor, a plurality of groups of serially connected fuse and capacitor F1 and C1, F2 and C2, ..., Fn and Cn are connected in parallel between node n1 and node n2.

In FIG. 14, the capacitance of the on-die capacitor can be adjusted by cutting fuses F1 to Fn using a laser at the wafer level.

Figure 15:
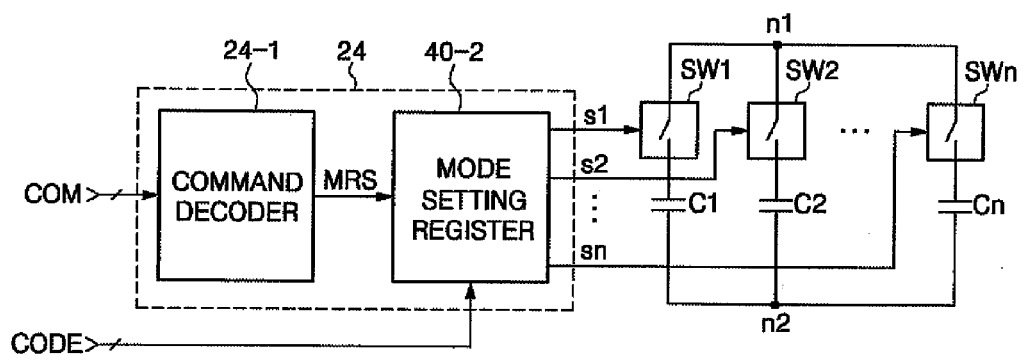
FIG. 15 is a schematic diagram illustrating an on-die capacitor of a semiconductor device in accordance with another embodiment of the inventive concept.

FIG. 15 is a schematic diagram illustrating an on-die capacitor of a semiconductor device in accordance with another embodiment of the inventive concept. In the on-die capacitor, a plurality of groups of serially connected switch and capacitor SW1 and F1, SW2 and F2, ..., SWn and Fn are connected in parallel between node n1 and node n2. And, the on-die capacitor additionally comprises switching control signal generator 24 to control switches SW1 to SWn. Switching control signal generator 24 may comprise command decoder 24-1 and mode setting register 24-2.

In FIG. 15, switching control signal generator 24 receives code signal CODE from the outside and sets switching control signals s1, s2, ..., sn in response to command signal COM. Command decoder 24-1 generates mode setting command MRS in response to command signal COM. Mode setting register 24-2 receives code signal CODE and sets switching control signals s1 to sn in response to mode setting command MRS. Switches SW1 to SWn are turned ON/OFF in response to set switching control signals s1 to sn and thereby change the capacitance of the on-die capacitor.

In the embodiment illustrated in FIG. 15, the capacitance of the on-die capacitor can be changed at the package level as well as the wafer level.

Since a capacitance can be changed using the on-die capacitors illustrated in FIGS. 14 and 15, a serial resonant frequency can be adjusted to be the same as a parallel resonant frequency.

Consequently, the semiconductor devices illustrated in FIGS. 9 to 11 can decrease power voltage noise by lowering impedance at a resonant frequency using the capacitance of an on-die capacitor and the inductance of a wire.

Figure 5:
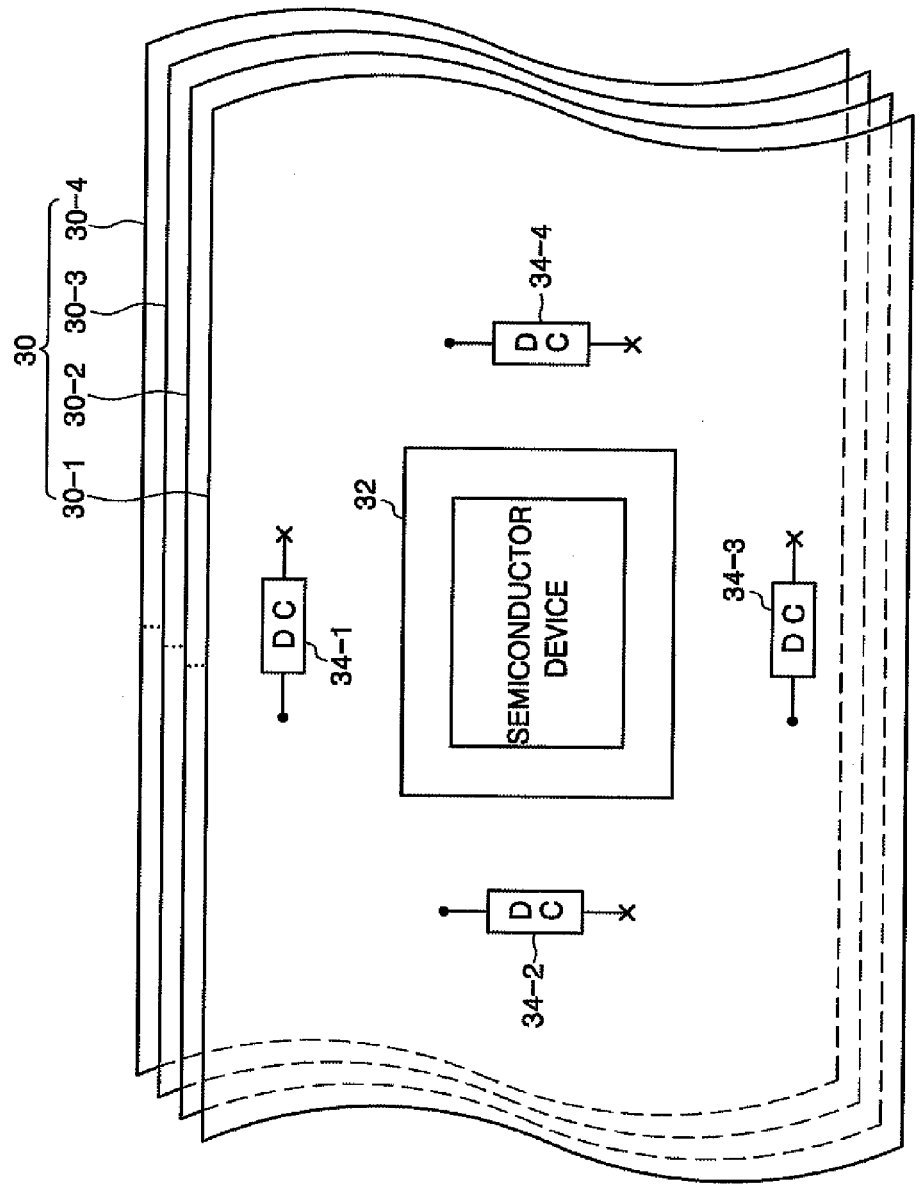
FIG. 5 is a schematic diagram illustrating a conventional printed circuit board (PCB)
Figure 16:
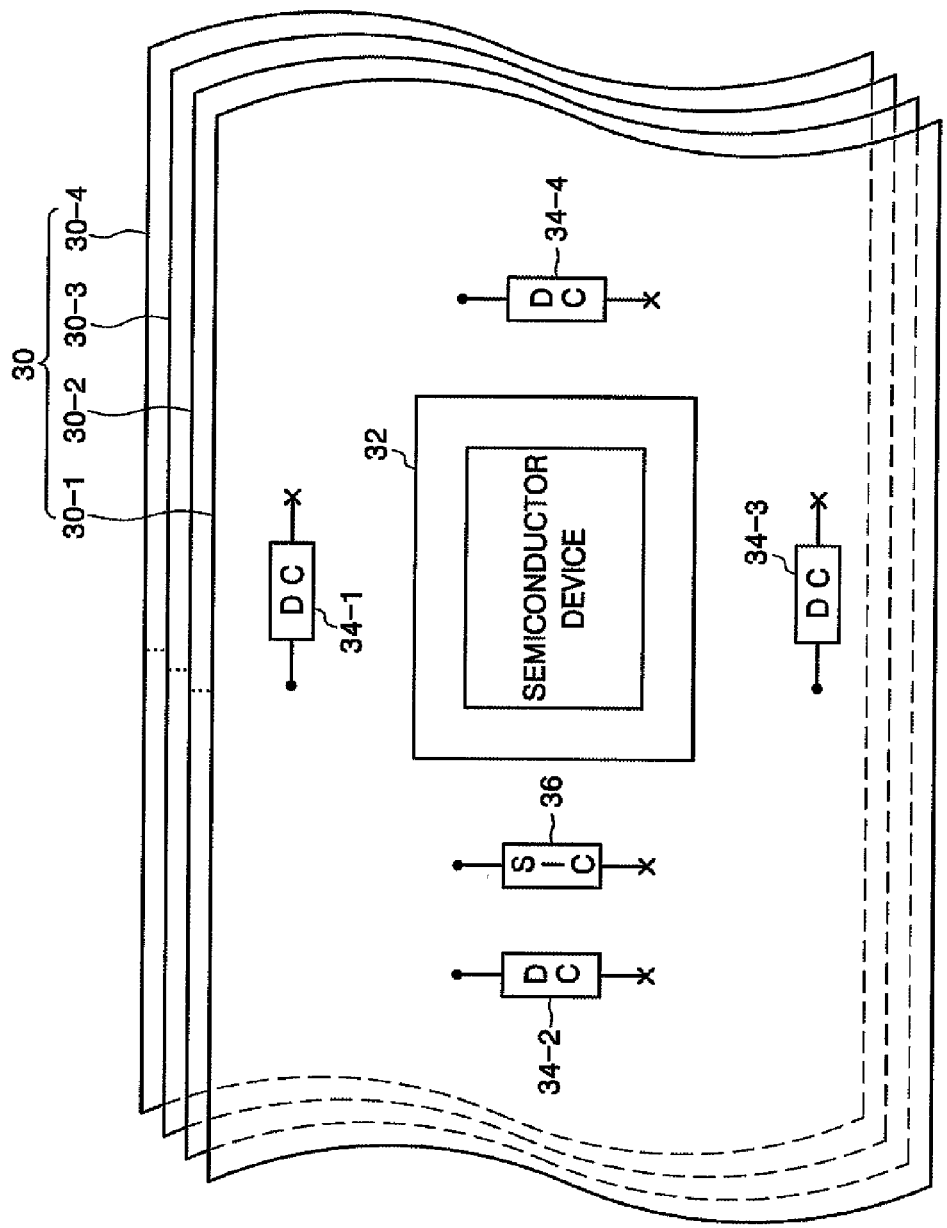
FIG. 16 is a schematic diagram illustrating a PCB in accordance with an embodiment of the inventive concept.

FIG. 16 is a schematic diagram illustrating a printed circuit board (PCB) in accordance with an embodiment of the inventive concept. The PCB of FIG. 16 is similar to the PCB of FIG. 5, except that the PCB of FIG. 15 additionally comprises an impedance circuit 36.

Figure 6:
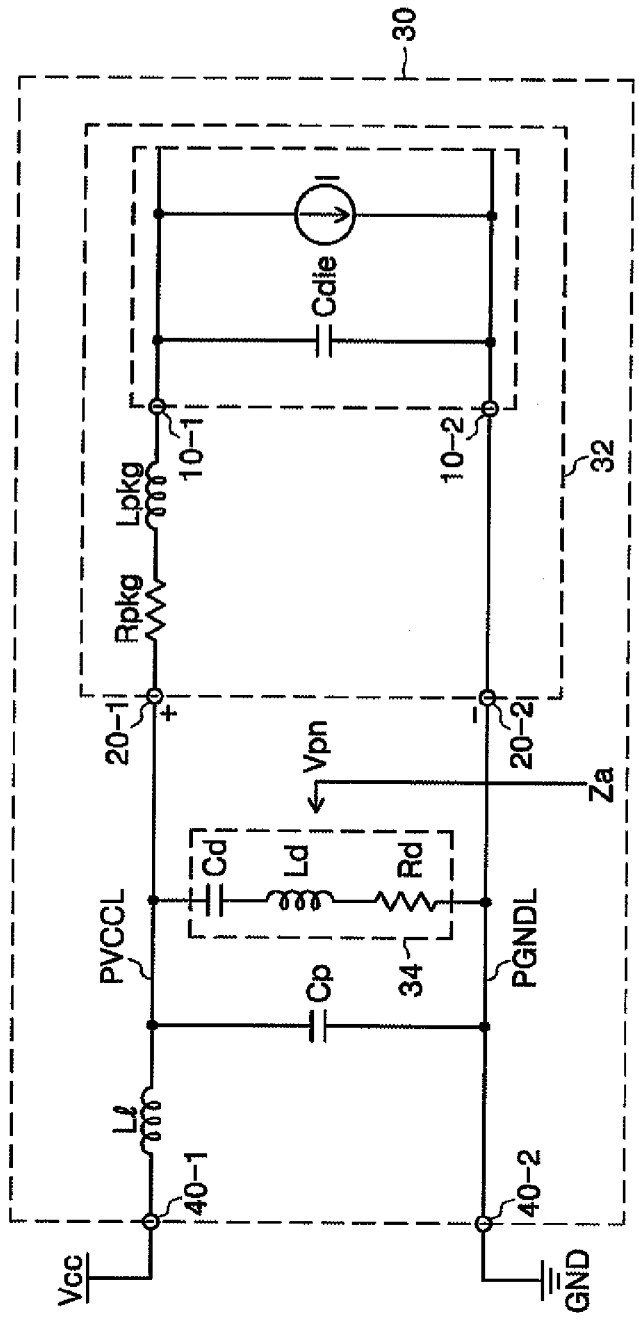
FIG. 6 is an equivalent circuit illustrating the PCB of FIG. 5.
Figure 17:
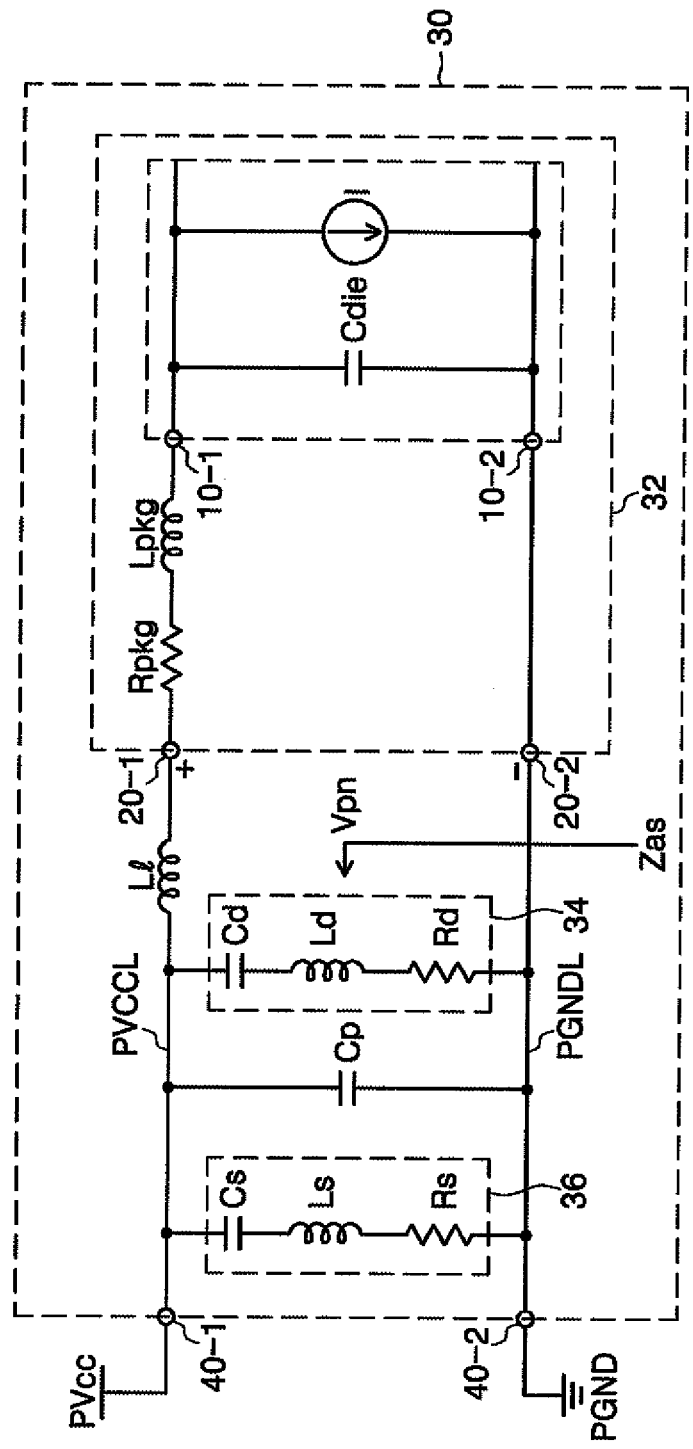
FIG. 17 is an equivalent circuit illustrating the PCB of FIG. 16.

FIG. 17 is an equivalent circuit illustrating the PCB of FIG. 16. Referring to FIG. 17, impedance circuit 36 comprises a capacitor Cs, an inductor Ls, and a resistor Rs that are connected in series. The equivalent circuit of FIG. 10 is similar to the equivalent circuit of FIG. 6, except that the equivalent circuit of FIG. 17 additionally comprises impedance circuit 36. Impedance circuit 36 is connected to decoupling capacitors 34-1 to 34-4, which are represented by element 34 in FIG. 17. Like decoupling capacitors 34-1 to 34-4, impedance circuit 36 of the PCB of FIG. 17 comprises a capacitor, an inductor, and a resistor connected in series. However, unlike decoupling capacitors 34-1 to 34-4, impedance circuit 36 is adapted to lower the impedance at the resonant frequency to thereby reduce the power voltage noise at the resonant frequency of the PCB.

A parallel resonant impedance of the circuit illustrated in FIG. 17 is defined by Equation 3, and a serial resonant impedance of the circuit illustrated in FIG. 17 is defined by Equation 4:

$$Zas = \frac{Vpn}{I} = Rs + j\left(\omega(Ls + L1) - \frac{1}{\omega Cs}\right).$$

A serial resonant frequency obtained from Equation 4 is $$\frac{1}{2\pi\sqrt{Cs(Ls + L1)}}.$$

Power voltage noise Vpn increases as electrical current I increases, and power voltage noise Vpn has a minimum level at the serial resonant frequency, and since the serial resonant frequency is inversely proportional to the inductance "Ls+L1", power voltage noise Vpn decreases as the inductance decreases.

Thus, the semiconductor device of FIG. 16 can reduce the power voltage noise at the resonant frequency by making the resonant frequency of the serial resonant circuit and the resonant frequency of the parallel resonant circuit the same and offsetting a maximum value of the power voltage noise Vpn obtained by resonance of the parallel resonant circuit with a minimum value of the power voltage noise Vpn obtained by resonance of the serial resonant circuit. That is, it is possible to reduce the impedance of power voltage terminal 40-1 and ground voltage terminal 40-2.

In the PCB of FIG. 16, in accordance with an embodiment of the inventive concept, the capacitor, the inductor, and the resistor of impedance circuit 36 may each be discrete components disposed on substrate 30 (i.e., disposed on the PCB).

Alternatively, in the PCB of FIG. 16, in accordance with another embodiment of the inventive concept, the capacitor may be a discrete component disposed on substrate 30 (i.e., disposed on the PCB), the inductor may be realized by helically arranging on signal line layer 30-1 or signal line layer 30-4 a signal line connected from at least one end of impedance circuit 36 to at least one of power voltage layer 30-2 and ground voltage layer 30-3, and, rather than providing a discrete resistor, an amount of resistance imparted by impedance circuit 36 may be set by controlling the length and width of the helically-arranged signal line mentioned above.

In the PCB of FIGS. 16 and 17, in accordance with an embodiment of the inventive concept, the resonant frequency of impedance circuit 36 is preferably set to a resonant frequency in a range of 0.8 fr to 1.2 fr, where "fr" is the resonant frequency of the PCB without capacitor Cs of impedance circuit 36.

Figure 18:
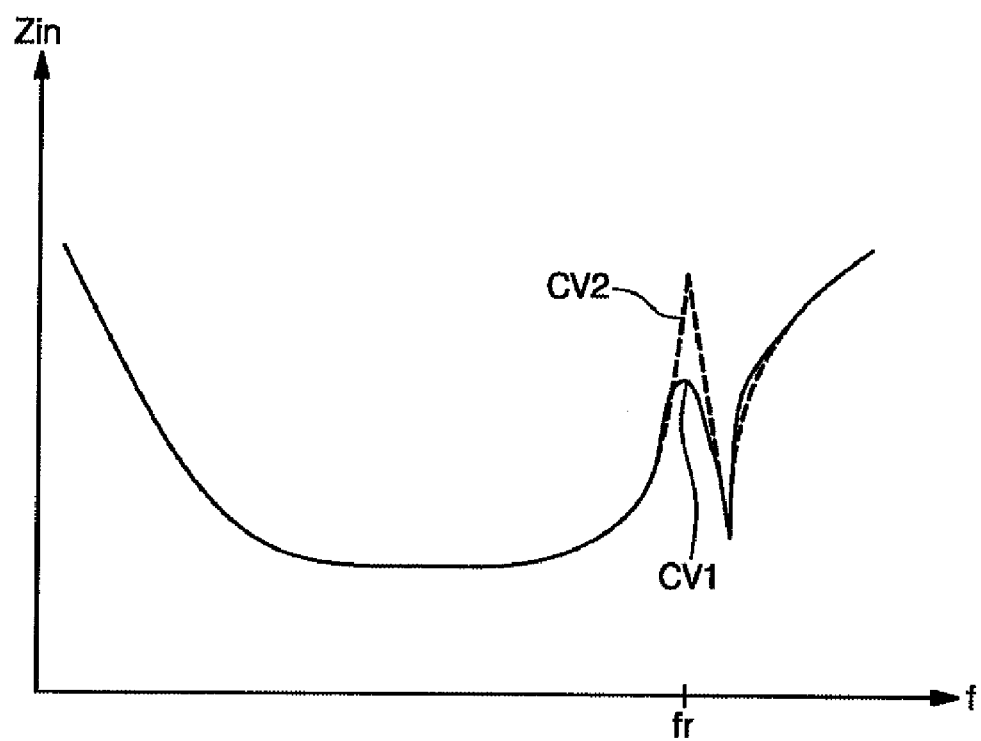
FIG. 18 is a graph illustrating an impedance characteristic with respect to a frequency of a PCB in accordance with an embodiment of the inventive concept.

FIG. 18 is a graph illustrating an impedance characteristic with respect to a frequency of the PCB in accordance with an embodiment of the inventive concept. In the graph of FIG. 18, the horizontal axis represents frequency, the vertical axis represents impedance, solid line CV1 shows variation in impedance in a PCB in accordance with an embodiment of the inventive concept, and dotted line CV2 shows variation in impedance in a conventional PCB. It is evident from the graph of FIG. 11 that, while the impedance of the conventional PCB at the resonant frequency is relatively high, indicating that the power voltage noise of the conventional PCB is relatively high, the impedance of the PCB in accordance with an embodiment of the inventive concept at the resonant frequency is relatively low, indicating that the power voltage noise of the PCB in accordance with an embodiment of the inventive concept is relatively low. In FIG. 18, frequency "fr" indicates the resonant frequency of the conventional PCB and the PCB in accordance with an embodiment of the inventive concept.

Accordingly, a PCB in accordance with an embodiment of the inventive concept does not simply shift the resonant frequency of the PCB to a frequency that is higher than the operable frequency of the semiconductor device by adding decoupling capacitors, but reduces the impedance at the resonant frequency to thereby reduce the power voltage noise which can occur at the resonant frequency. That is, when a PCB in accordance with an embodiment of the inventive concept comprises the appropriate number of decoupling capacitors, the resonant frequency of the PCB will be higher than the operable frequency of a corresponding semiconductor device, and, when the resonant frequency of an impedance circuit of the PCB is appropriately adjusted, power voltage noise occurring at the resonant frequency of the PCB may be reduced.

A semiconductor device in accordance with an embodiment of the inventive concept may have reduced AC component power voltage noise relative to a conventional semiconductor device and may have DC component power voltage noise that does not increase relative to a conventional semiconductor device. In addition, in accordance with the method for reducing power voltage noise in a semiconductor device in accordance with an embodiment of the inventive concept, AC component power voltage noise may be reduced and DC component power voltage noise may be prevented from increasing. Thus, the semiconductor device in accordance with an embodiment of the inventive concept may have improved performance.

Further, in accordance with an embodiment of the inventive concept, by adding an impedance circuit to a PCB, the power voltage noise occurring at the resonant frequency of the PCB may be reduced.

What is claimed is:

1. A semiconductor device, comprising:
   a chip having a plurality of first power voltage terminals connected in common to a first power voltage line, a plurality of second power voltage terminals connected in common with a second power voltage line, a first connection terminal, a second connection terminal connected to the first power voltage line or the second power voltage line, and an on-die capacitor; and
   a package having a plurality of third power voltage terminals connected to the first power voltage terminals through a first wire by wire bonding during a packaging process and a plurality of fourth power voltage terminals connected to the second power voltage terminals through a second wire by wire bonding during the packaging process, and configured to package the chip,
   wherein one end of the on-die capacitor is connected to the first connection terminal, and the first connection terminal is connected to the second connection terminal through a third wire by wire bonding during the packaging process.

2. The semiconductor device of claim 1, wherein a capacitance of the on-die capacitor is adjusted to make a product of the capacitance of the on-die capacitor and an inductance of the third wire equal to a product of an inductance of a package inductor present in the package and a capacitance of a static capacitor present in the chip.

3. The semiconductor device of claim 2, wherein the on-die capacitor comprises a plurality of groups, each group having a serially connected fuse and capacitor connected in parallel between one end and the other end of the on-die capacitor, wherein the capacitance of the on-die capacitor is adjustable by cutting one or more fuses in the plurality of groups.

4. The semiconductor device of claim 2, further comprising:
   a switching control signal generator configured to receive a code signal and set a plurality of switching control signals in response to an externally applied command signal,
   wherein the on-die capacitor comprises a plurality of groups, each group having serially connected switch and capacitor connected in parallel between one end and the other end of the on-die capacitor, and
   each switch in the plurality of groups being respectively turned ON/OFF in response to one of the plurality of switching control signals to change the capacitance of the on-die capacitor.

5. The semiconductor device of claim 2, wherein the inductance is additionally adjustable in accordance with a length of the third wire.

6. A semiconductor device, comprising:
   a chip having a plurality of first power voltage terminals connected in common to a first power voltage line, a plurality of second power voltage terminals connected in common with a second power voltage line, a first connection terminal, a second connection terminal, a first on-die capacitor, and a second on-die capacitor; and
   a package having a plurality of third power voltage terminals connected to the first power voltage terminals through a first wire by wire bonding during a packaging process and a plurality of fourth power voltage terminals connected to the second power voltage terminals through a second wire by wire bonding during the packaging process, and configured to package the chip, wherein the first on-die capacitor is connected between the first connection terminal and the first power voltage line, the second on-die capacitor is connected between the second connection terminal and the second power voltage line, and the first connection terminal is connected to the second connection terminal through a third wire by wire bonding during the packaging process.

7. The semiconductor device of claim 6, wherein respective capacitances of the first and second on-die capacitors are adjustable such that a product of the capacitances of the first and second on-die capacitors and an inductance of the third wire is equal to a product of an inductance of a package inductor present in the package and a capacitance of a static capacitor of the chip.

8. The semiconductor device of claim 7, wherein each of the first and second on-die capacitors comprises a plurality of groups, each group having serially connected fuse and capacitor connected in parallel between one end and the other end of the on-die capacitor, and the capacitance of the on-die capacitor is adjustable by cutting one or more fuses within the plurality of groups.

9. The semiconductor device of claim 7, further comprising:

a switching control signal generator configured to receive a code signal and set a plurality of switching control signals in response to an externally applied command signal, wherein each one of the first and second on-die capacitors comprises a plurality of groups, each group having a serially connected switch and capacitor connected in parallel between one end and the other end of the respective first and second on-die capacitor, and switches within the plurality of second groups are respectively turned ON/OFF in response to one of the plurality of switching control signals to change the capacitances of the respective first and second on-die capacitors.

10. The semiconductor device of claim 7, wherein the inductance is additionally adjustable in accordance with a length of the third wire.

* * * * *